US010217729B2

United States Patent
Ahmed et al.

(10) Patent No.: US 10,217,729 B2
(45) Date of Patent: Feb. 26, 2019

(54) APPARATUS FOR MICRO PICK AND BOND

(71) Applicant: Intel Corporation, Santa Clara, CA (US)

(72) Inventors: Khaled Ahmed, Anaheim, CA (US); Kunjal ShyamKumar Parikh, Fremont, CA (US); Peter Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,102

(22) Filed: Sep. 30, 2016

(65) Prior Publication Data

US 2018/0096977 A1    Apr. 5, 2018

(51) Int. Cl.
*H01L 25/13*    (2006.01)
*H01L 25/075*    (2006.01)
(Continued)

(52) U.S. Cl.
CPC .......... *H01L 25/13* (2013.01); *H01L 21/6838* (2013.01); *H01L 24/75* (2013.01);
(Continued)

(58) Field of Classification Search
CPC ............ H01L 25/16; H01L 25/50; H01L 2224/775252;
(Continued)

(56) References Cited

U.S. PATENT DOCUMENTS 6,613,610 B2 *   9/2003   Iwafuchi ............. H01L 21/2007
                                                    438/128
6,621,157 B1 *   9/2003   Wirz ..................... H01L 21/563
                                                    156/105
(Continued)

FOREIGN PATENT DOCUMENTS

JP    2010-251360    11/2010
JP    2014-529908    11/2014
(Continued)

OTHER PUBLICATIONS

International Search Report and Written Opinion from PCT/US2017/061117, dated Mar. 5, 2018, 8 pages.
(Continued)

*Primary Examiner* — Marvin Payen
*Assistant Examiner* — Jeremy Joy
(74) *Attorney, Agent, or Firm* — Schwabe, Williamson & Wyatt, P.C.

(57) ABSTRACT

Embodiments of the invention include systems and methods for transferring micro LEDs. In an embodiment, the system for transferring micro LEDs, may include a donor substrate bank that is capable of supporting a plurality of donor substrates on which a plurality of micro LEDs are formed. In an embodiment, the donor substrate bank is moveable in the X, Y, and Z directions. In an embodiment, the system may also include a host substrate table that is capable of supporting a host substrate. The host substrate may include a plurality of segments. In an embodiment, the host substrate table is moveable in the X, Y, and Z directions. Embodi-
(Continued)

ments of the invention may also include an array of macro transfer heads. In an embodiment, each macro transfer head may include a plurality of micro transfer heads.

23 Claims, 9 Drawing Sheets (51) Int. Cl.
 *H01L 21/683* (2006.01)
 *H01L 23/00* (2006.01)
 *H01L 25/00* (2006.01)
(52) U.S. Cl.
 CPC .......... *H01L 24/95* (2013.01); *H01L 25/0753* (2013.01); *H01L 25/50* (2013.01); *H01L 2224/7565* (2013.01); *H01L 2224/75252* (2013.01)
(58) Field of Classification Search
 CPC .............. H01L 2224/7525–2224/75843; H01L 21/683–21/68792; H01L 24/74–24/799; H01L 24/93–24/97; H01L 25/0753; H01L 25/048; H01L 25/13; H01L 25/167; H01L 27/1266; H01L 2221/67–2221/68395; H01L 2224/79252
 See application file for complete search history.

(56) References Cited

U.S. PATENT DOCUMENTS

| | | | | |
|---|---|---|---|---|
| 7,165,711 B2* | 1/2007 | Barretto | ............. | H01L 21/6835 228/49.5 |
| 7,364,983 B2* | 4/2008 | Wang | ............... | G06K 19/07749 257/620 |
| 8,104,666 B1* | 1/2012 | Hwang | ................ | B23K 1/0012 228/180.22 |
| 8,951,888 B2* | 2/2015 | Suga | ................... | H01L 27/1214 438/458 |
| 8,985,810 B2* | 3/2015 | Woodgate | ............... | F21K 9/232 362/249.02 |
| 9,966,357 B2* | 5/2018 | Hwang | ................... | H01L 24/97 |
| 2002/0064032 A1* | 5/2002 | Oohata | .................... | H04N 9/30 361/760 |
| 2005/0032259 A1 | 2/2005 | Nakajima et al. | | |
| 2007/0032083 A1 | 2/2007 | Choi | | |
| 2010/0147358 A1* | 6/2010 | Ohtorii | ................. | H01L 31/153 136/244 |
| 2010/0259164 A1* | 10/2010 | Oohata | ............... | H01L 25/0753 313/505 |
| 2012/0064720 A1 | 3/2012 | Chen et al. | | |
| 2012/0273831 A1* | 11/2012 | Suga | ................... | H01L 27/1266 257/99 |
| 2013/0115752 A1* | 5/2013 | Hwang | ............. | H01L 21/67144 438/455 |
| 2013/0210194 A1* | 8/2013 | Bibl | ........................ | H01L 24/83 438/107 |
| 2014/0084482 A1* | 3/2014 | Hu | .......................... | H01L 24/06 257/774 |
| 2016/0155892 A1 | 6/2016 | Li et al. | | |
| 2016/0163765 A1 | 6/2016 | Hu et al. | | |
| 2016/0329274 A1 | 11/2016 | Jen | | |
| 2017/0170141 A1* | 6/2017 | Oppermann | ............ | H01L 24/83 |
| 2017/0278733 A1* | 9/2017 | Chang | ............... | H01L 21/67144 |

FOREIGN PATENT DOCUMENTS

| | | |
|---|---|---|
| KR | 10-2008-0056763 | 6/2008 |
| KR | 10-2016-0087264 | 7/2016 |
| WO | WO 2016060677 A1 * | 4/2016 |

OTHER PUBLICATIONS

International Search Report and Written Opinion for PCT/US2017/048918 dated Dec. 5, 2017, 13 pages.

* cited by examiner

APPARATUS FOR MICRO PICK AND BOND

FIELD OF THE INVENTION

Embodiments of the present invention relate generally to systems and methods for transferring micro light emitting diodes (LEDs). In particular, embodiments of the present invention relate to micro transfer picking and bonding micro LEDs from a plurality of donor substrates to a host substrate simultaneously.

BACKGROUND OF THE INVENTION

The production cost of micro LED displays is very sensitive to the transfer tact time of micro LEDs from the substrate on which the micro LEDs are formed (i.e., a donor substrate) to the thin-film-transistor (TFT) backplanes on the substrate on which the micro LED display is formed (i.e., the host substrate), especially for large size displays (such as tablets or notebooks). Each pixel in an LED display typically includes at least a red LED, a green LED, and a blue LED. The different colored LEDs each require different processing conditions and materials. In the case of active matrix micro LED display panels, GaN-based micro LEDs that emit red, green, and blue colors are fabricated on different donor substrates. The different colored LEDs then need to be transferred from their donor substrates to thin-film-transistor (TFT) backplanes on the host substrate to make red, green, blue (RGB) pixels. Since the different LED colors are formed on different host substrates, the transfer process has to be executed three times to accommodate each of the three colors, thereby further increasing the overall transfer time and increasing production cost.

Furthermore, the acceptable defect density of displays needs to be approximately 1 pixel per million (ppm). In order to achieve this defect density requirement, two micro LEDs for each color (red, green, and blue) may be used in each pixel to provide redundancy. However, transferring more micro LEDs results in higher manufacturing costs due to the increased transfer time.

One approach to meet both cost and defect density requirements is to manufacture monolithic red, green, and blue LED pixels on the host wafers then transfer the whole pixel (as opposed to transferring individual micro LEDs with different colors). However, manufacturing three colors monolithically on the same wafer is challenging, especially when the maximum power efficacy of individual red, green, and blue LEDs require different processing temperatures and other metalorganic vapor phase epitaxy (MOVPE) process parameters.

DETAILED DESCRIPTION OF THE INVENTION

Described herein are methods for transferring micro LEDs for use in micro LED displays and systems used in the transfer process. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the cost of active matrix micro LED displays may be reduced when the transfer tact time is minimized. Accordingly, embodiments of the invention include systems and methods for transferring micro LED devices from one or more donor substrates (i.e., the substrate on which the micro LEDs are formed) to a large host substrate (i.e., the substrate on which the active matrix micro LED display is formed). In an embodiment, the large host substrate may be a glass substrate. Embodiments of the invention are highly scalable, and allow for the glass substrate to be any size. Accordingly, embodiments of the invention are equally applicable to any generation glass size (e.g., Gen8, Gen9, Gen10, and beyond). As the size of the host substrate increases, the efficiency of the transfer process may increase as well, thereby reducing manufacturing costs even further.

Particularly, embodiments of the invention include using an array of macro transfer heads in order to transfer a plurality of micro LEDs at a time. For example, each macro transfer head may include millions of micro transfer heads. The number of micro transfer heads on each macro transfer head is dependent on the area of the macro transfer head divided by the area of each micro transfer head and the pitch between the micro transfer heads. For example, when a micro transfer head is 46 μm×70 μm, a 5 inch×5 inch macro transfer head may include approximately five million micro transfer heads. Accordingly, each macro transfer head may be able to transfer millions of micro LEDs at a time.

While the macro transfer head may be any size, in some embodiments, the macro transfer head may be approximately the same size as the donor substrate on which the micro LEDs are fabricated. For example, micro LEDs may be fabricated on a GaN-on-Si donor substrate that is approximately 12 inches in diameter (e.g., 300 mm wafers). Since each macro transfer head may be able to transfer all of the micro LEDs on each donor substrate in a single transfer process, the larger the donor substrate size (and the larger the size of the macro transfer head) the higher the transfer throughput. Accordingly, embodiments of the invention allow for a lower cost of production of the active matrix micro LED displays.

Additional embodiments of the invention may also allow for increased throughput by utilizing banks or cassettes of donor substrates. Accordingly, the transfer process may be repeated rapidly without having to supply additional donor substrates. In some embodiments, the bank of donor substrates may include donor substrates that have different LED colors formed on them. For example, a bank of donor substrates may include red, green, and blue donor substrates. In such an embodiment, all three colors may be transferred in a single transfer process, even though the red micro LEDs, the green micro LEDs, and the blue micro LEDs are each formed on different donor substrates.

Figure 1A:
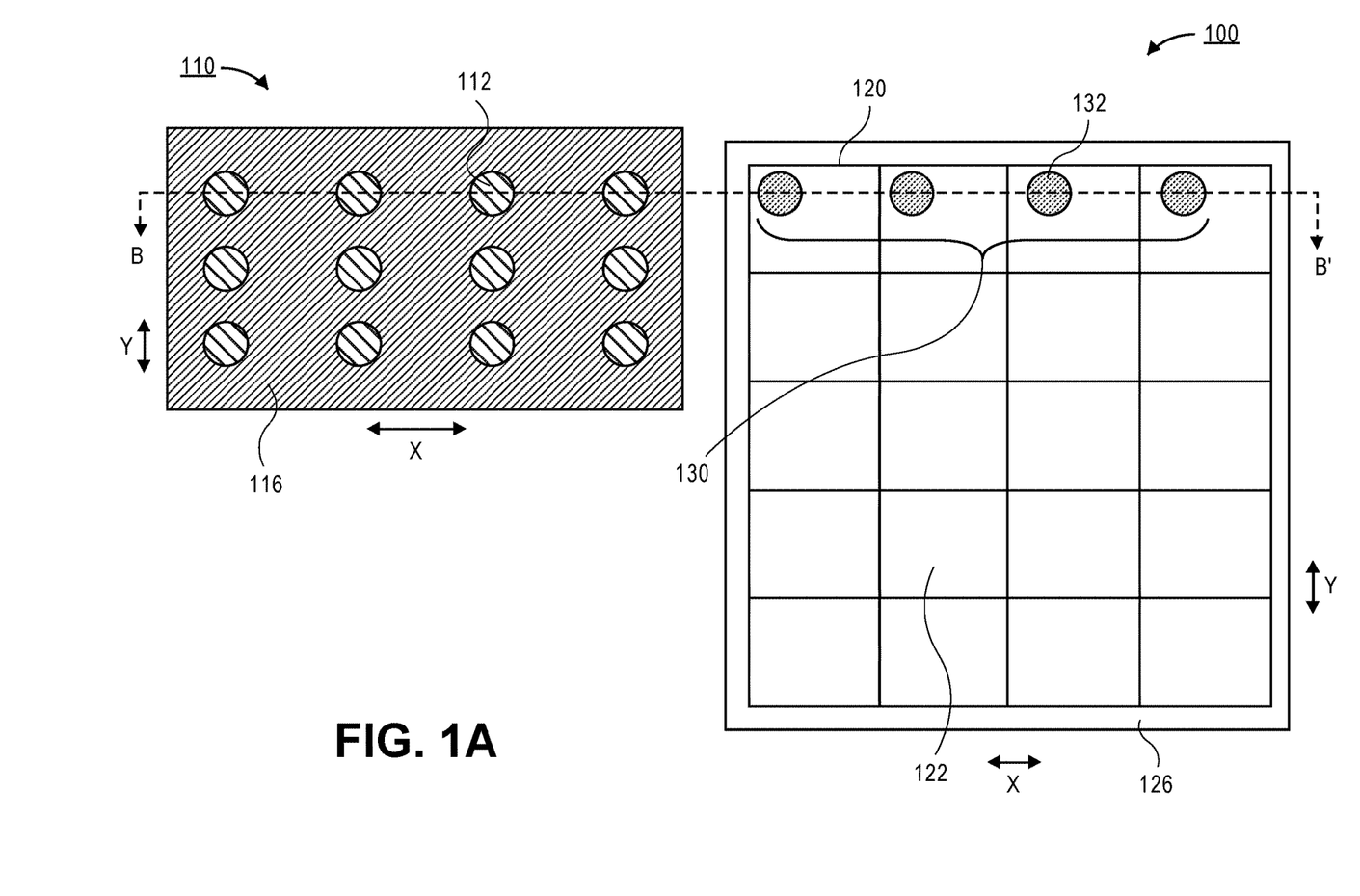
FIG. 1A is a plan view illustration of a system used for transferring micro LEDs, according to an embodiment of the invention.
Figure 1B:
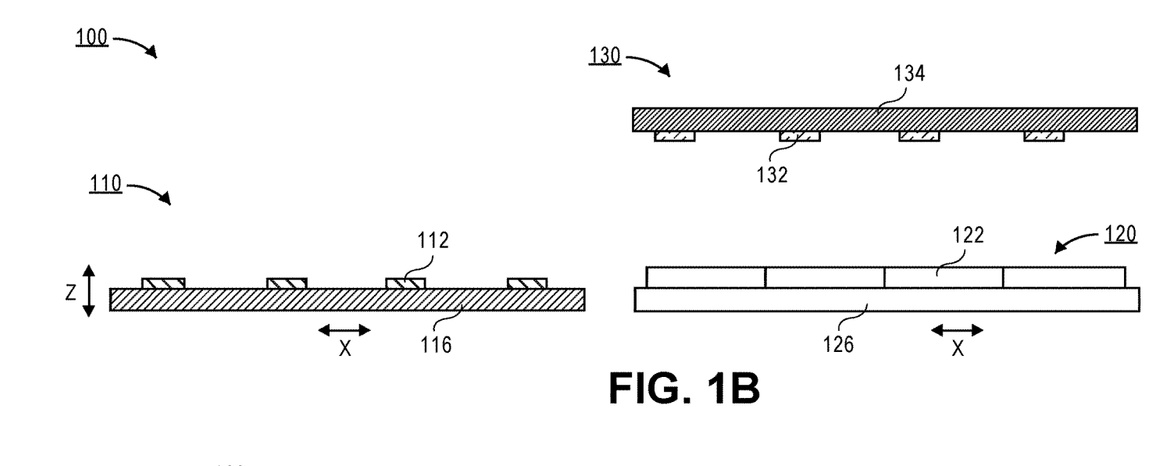
FIG. 1B is a cross-sectional illustration of the system in FIG. 1A, along line B-B', according to an embodiment of the invention.

Referring now to FIGS. 1A and 1B, a schematic plan view illustration and corresponding cross-sectional illustration along line B-B' of a micro LED transfer system 100 are shown, respectively, according to an embodiment of the invention. In an embodiment the micro LED transfer system 100 may include a donor substrate bank 110, a host substrate 120, and an array or macro transfer heads 130.

In an embodiment of the invention, the donor substrate bank 110 may include a plurality of donor substrates 112. Each of the donor substrates 112 may be any suitable substrate on which micro LEDs have been formed. For example, the micro LEDs may be formed on a GaN-based semiconducting substrate. In some embodiments, the GaN-based semiconducting substrate may be grown over a silicon substrate. Depending on the size of the substrate, millions of micro LEDs may be formed on each donor substrate 112. In an embodiment, the donor substrates 112 may have a diameter of 1 inch or greater. In a particular embodiment, the donor substrates 112 are 12 inch substrates or greater. In the illustrated embodiment, each of the donor substrates 112 are illustrated as being the same, though embodiments are not limited to such configurations. As will be described in greater detail below, the bank of donor substrates 110 may include donor substrates 112 that include red, green, or blue micro LEDs.

In an embodiment, the host substrate 120 may be any suitable substrate on which an active matrix micro LED display may be formed. For example, the host substrate 120 may be glass. Additionally, the host substrate 120 may be any size. The size of the glass substrates used in manufacturing are generally categorized by generation (e.g., Gen6, Gen8, Gen10, etc.). Due to the scalability of embodiments of the invention, it is to be appreciated that any generation of glass substrate may be used.

In an embodiment, the host substrate 120 may comprise a plurality of segments 122. For example, the segments 122 may each correspond to an individual display that is being fabricated. Accordingly, a large host substrate 120 may be utilized to form a plurality of displays in parallel. The size of each segment 122 may depend on the desired size of the display. In some embodiments, each segment 122 may be 0.5 m×0.5 m or larger. Additional embodiments may include segments 122 that are smaller than 0.5 m×0.5 m. In the illustrated embodiment, the segments are substantially square in shape. However, the segments 122 may be any desired shape (e.g., rectangular).

In an embodiment, the array of transfer heads 130 is shown as having macro transfer heads 132 that are substantially the same size as the donor substrates 112. In such embodiments, each macro transfer head 132 may be able to transfer all of the micro LEDs formed on each donor substrate 112 with a single transfer process. However, it is to be appreciated that embodiments may also include macro transfer heads that are different sizes than the donor substrates 112. In the illustrated embodiment, the number of macro transfer heads 132 in the array of transfer heads 130 is equal to the number of columns of segments 122 formed on the host substrate 120. In such an embodiment, each of the macro transfer heads 132 may be dedicated to mounting micro LEDs in the segments 122 along a single column. Accordingly, in some embodiments, each segment 122 will receive micro LEDs from a single macro transfer head 132. However, as will be described in greater detail below, additional embodiments may include segments 122 that receive micro LEDs from more than one macro transfer head 132.

In an embodiment, each of the macro transfer heads 132 in the transfer head array 130 may be mounted to a plate 134 or other structure. In the plan view illustration in FIG. 1A, the plate 134 is omitted in order to not obscure the details of the host substrate 120 and the individual macro transfer heads 132. However, as shown in the cross-sectional illustration in FIG. 1B, it is to be appreciated that each of the macro transfer heads 132 may be attached to the plate 134 so that the macro transfer heads 132 are positioned at a Z-height that is above the Z-heights of the host substrate 130 and the bank of donor substrates 110. In an embodiment, the plate 134 may include electronics, heating elements, and any other components needed to operate the macro transfer heads.

According to an embodiment, the array of transfer heads 130 may be substantially stationary (e.g., the array of transfer heads 130 may not move during the micro LED transfer process). Instead, the bank of donor substrates 110 and the host substrate may be moved in the X, Y, and Z directions (as indicated by the arrows in FIGS. 1A and 1B) in order to implement the micro LED transfer process, as will be described in greater detail below. In order to implement movement, the host substrate 120 may be supported on a moveable table 126. In an embodiment, the bank of donor substrates 110 may also be supported on a moveable table 116. In an embodiment, the moveable table 116 and the moveable table 126 may be controlled independently of each other. In some embodiments, a single moveable table (not shown) may support both the bank of donor substrates 110 and the host substrate 130.

Figure 2:
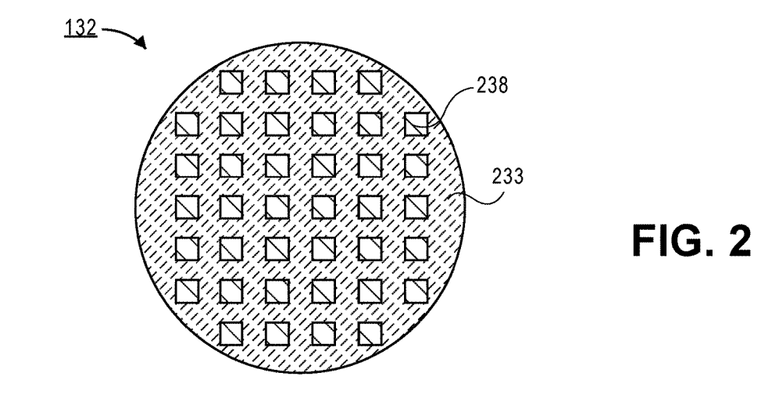
FIG. 2 is a plan view illustration of a macro transfer head that may be used in a micro LED transfer system, according to an embodiment of the invention.

Referring now to FIG. 2, a plan view illustration of a macro transfer head 132 is shown, according to an embodiment of the invention. In an embodiment, the macro transfer head 132 may include a plurality of micro transfer heads 238. The size and pitch of each of the micro transfer heads 238 may correspond to the size and pitch of the micro LEDs formed on each donor substrate 112. According to an embodiment, the number of micro transfer heads 238 may match the number of micro LEDs formed on each donor substrate 112. While the illustrated embodiment includes micro transfer heads 238 that are arranged in columns and rows, it is to be appreciated that the micro transfer heads 238 may be formed in any pattern. For example, the micro transfer heads 238 may be formed with the same pattern as the micro LEDs formed on the donor substrates 112.

In an embodiment, each micro transfer head 238 may be a protrusion that extends out from the main body 233 of the macro transfer head 132. In an embodiment, the main body 233 may be any suitable material on which each micro transfer head 238 may be fabricated or mounted. For example, the main body 233 may be a semiconductor material (e.g., silicon), a metallic material, a glass material, or the like. In some embodiments, the main body 233 may be the same material as the micro transfer head 238. Additional embodiments may include micro transfer heads 238 that include different materials than the main body 233. In an embodiment, the micro transfer heads may include several different materials. For example, when the micro transfer head utilizes electrostatic forces to transfer the micro LEDs, the micro transfer heads 238 may include conductive materials to form electrodes and insulative materials to isolate the electrodes from each other. According to an embodiment, the micro transfer heads 238 are formed from materials that are able to resist wear and degradation in order to utilize each transfer head 238 through many (e.g., hundreds, thousands, or more) transfer cycles. In an embodiment, the transfer heads may be replaceable in order to recycle the main body 233 once the micro transfer heads 238 are significantly worn.

According to an embodiment, the main body 233 may include circuitry, vacuum lines, heating elements, or the like (not shown) in order to implement various transfer processes described in greater detail herein. For example, embodiments of the invention may include any suitable picking and placing process to implement the micro LED transfer. For example, the micro transfer heads 238 may utilize electrostatic forces, magnetic forces, Van Der Waals forces, vacuum forces, or the like to secure micro LEDs to the micro transfer heads 238. Additionally, the micro transfer heads 238 may utilize bonding processes such as thermocompression bonding (TCB) in order to securely mount the micro LEDs to the host substrate 120. In such embodiments, a resistive heater (not shown) may be incorporated into each micro transfer head 238, the main body 233, or the plate 134.

In an embodiment, each of the micro transfer heads 238 may be controlled in unison. In such an embodiment, all of the micro LEDs on a donor substrate 112 may be transferred with a single transfer process. In alternative embodiments, each of the micro transfer heads 238 may be controlled independently or in independently controlled groups of micro transfer heads 238 in order to selectively transfer a selected portion of micro LEDs form on a donor substrate 112.

Figure 3A:
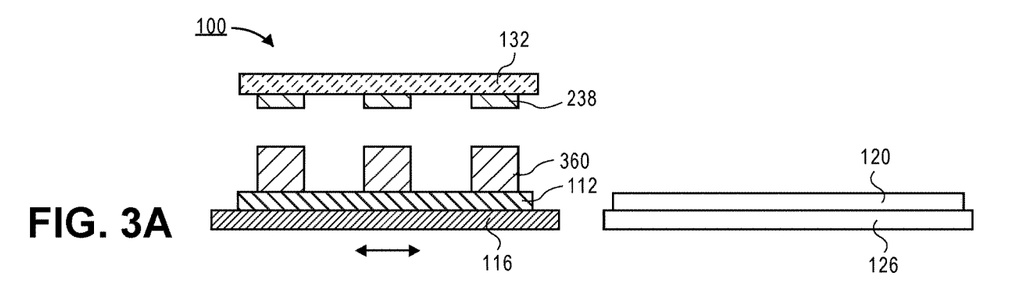
FIG. 3A is a cross-sectional illustration of a system used for transferring micro LEDs after a donor substrate is aligned with a macro transfer head, according to an embodiment of the invention.
Figure 3B:
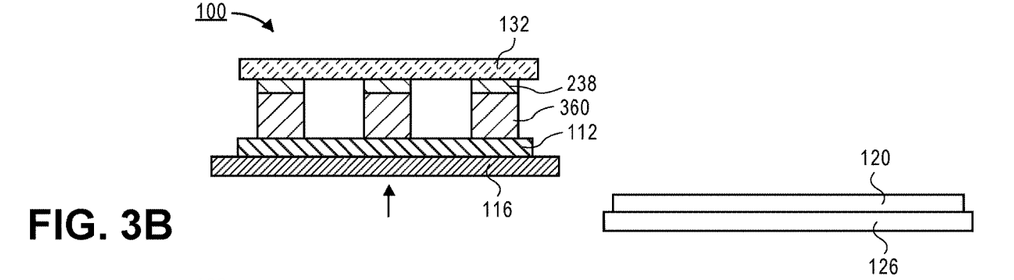
FIG. 3B is a cross-sectional illustration of a system used for transferring micro LEDs after the micro LEDs on the donor substrate are brought into contact with the micro transfer heads on the macro transfer head, according to an embodiment of the invention.
Figure 3C:
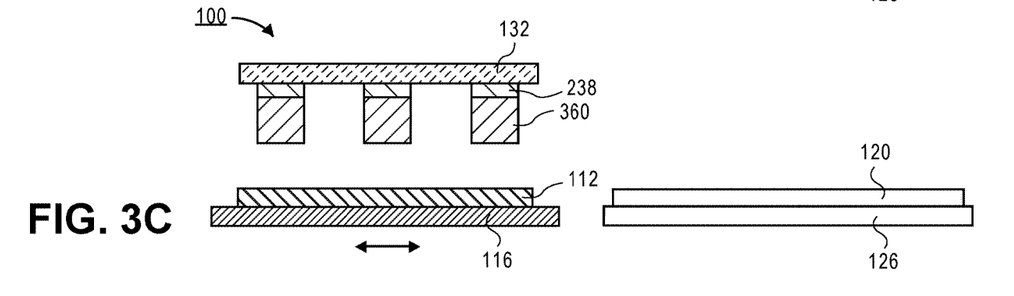
FIG. 3C is a cross-sectional illustration of a system used for transferring micro LEDs after the micro LEDs are removed from the donor substrate, according to an embodiment of the invention.
Figure 3D:
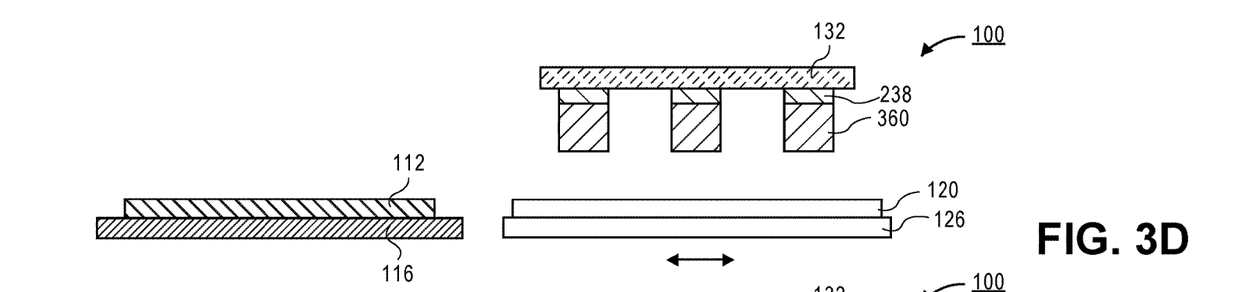
FIG. 3D is a cross-sectional illustration of a system used for transferring micro LEDs after the macro transfer head is aligned with the host substrate, according to an embodiment of the invention.
Figure 3E:
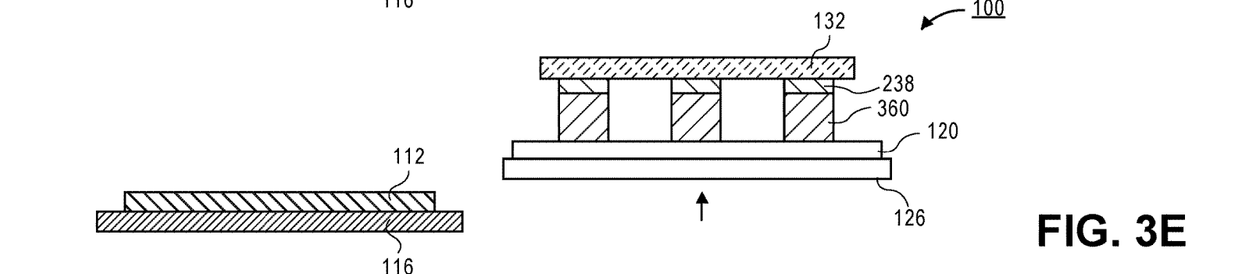
FIG. 3E is a cross-sectional illustration of a system used for transferring micro LEDs after the host substrate is brought into contact with the micro LEDs, according to an embodiment of the invention.
Figure 3F:
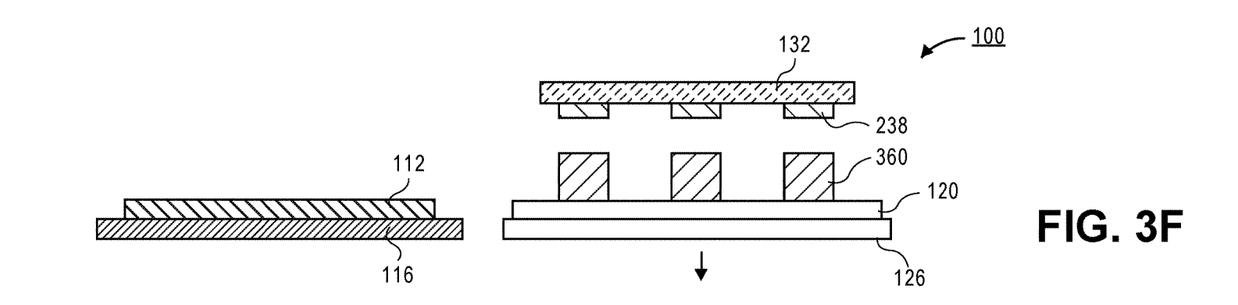
FIG. 3F is a cross-sectional illustration of a system used for transferring micro LEDs after the micro LEDs are mounted to the host substrate and the host substrate is moved away from the macro transfer head, according to an embodiment of the invention.
Figure 4:
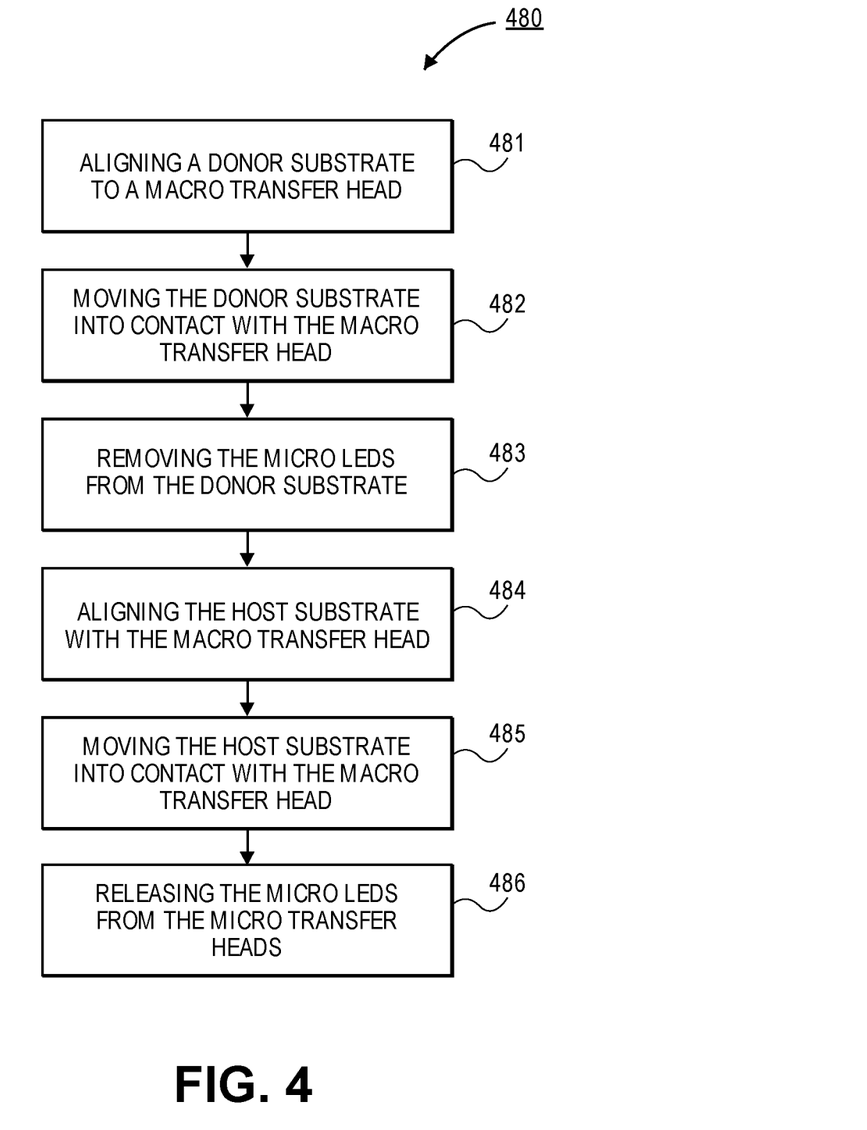
FIG. 4 is a process flow diagram of a process for transferring micro LEDs, according to an embodiment of the invention.

An exemplary process for transferring micro LEDs from a donor substrate 112 to a host substrate 120 according to an embodiment of the invention is shown and described with respect to the cross-sectional illustrations in FIGS. 3A-3F and the process flow diagram in FIG. 4. It is to be appreciated that the process shown is illustrative of a single macro transfer head 132 that includes a plurality of micro transfer heads 238 in order to not obscure aspects of the transfer process. However, it is to be appreciated that an array of transfer heads 130 may be used simultaneously to transfer micro LEDs from a plurality of donor substrates 112 in a bank of donor substrates 110 to the host substrate 120, similar to the system described above with respect to FIGS. 1A and 1B.

Referring now to FIG. 4, in an embodiment, the micro LED transfer process 480 may begin with operation 481 that includes aligning a donor substrate 112 to a macro transfer head 122. The cross-sectional illustration in FIG. 3A shows a system 100 for transferring micro LEDs 360 from a donor substrate 112 to a host substrate 120 with a macro transfer head 132 after the first operation 481 has been performed, according to an embodiment of the invention. In an embodiment, aligning the donor substrate 112 to the macro transfer head 122 may include positioning the donor substrate 112 so that micro LEDs 360 are positioned below the micro transfer heads 238 of the macro transfer head 122. Embodiments of the invention may include a substantially stationary macro transfer head 122. As such, the alignment may be implemented by moving the table 116 on which the donor substrate 112 is supported in the X direction as indicated by the arrow and/or in the Y direction (i.e., into and out of the plane of FIG. 3A).

After operation 481, embodiments may proceed to operation 482 that includes moving the donor substrate 112 into contact with the macro transfer head 132, as shown in FIG. 3B. According to an embodiment, the donor substrate 112 may be moved in the Z-direction towards the macro transfer head 132 so that the micro transfer heads 238 contact the micro LEDs 360 of the donor substrate 112.

After operation 482, embodiments may proceed to operation 483 that includes removing the micro LEDs 360 from the micro transfer heads 238, as shown in FIG. 3C. In an embodiment, the micro LEDs 360 are removed from the donor substrate 112 by activating a securing force in the micro transfer heads 238. In an embodiment, the securing force may be an electrostatic force, a magnetic force, Van Der Waals forces, a vacuum force, or the like. Additionally, the host substrate 120 may be moved away from the macro transfer head 112, as indicated by the arrow.

In the illustrated embodiment, all of the micro LEDs 360 are removed from the donor substrate 112. However, it is to be appreciated that embodiments where the micro transfer heads 238 are individually controllable, not all micro LEDs 360 may be removed from the donor substrate 112.

After operation 483, embodiments may proceed to operation 484 that includes aligning the host substrate 120 with the macro transfer head 132, as shown in FIG. 3D. In an embodiment, aligning the host substrate 120 to the macro transfer head 132 may include positioning the host substrate 120 so that the micro transfer heads 238 that are securing the micro LEDs 360 are positioned over the location on the host substrate 120 where the micro LEDs 360 are to be mounted. For example, the host substrate 120 may be positioned so that the micro LEDs 360 are positioned over circuitry, such as a TFT (not shown), in a particular segment 122 of the host substrate 120. Embodiments of the invention may include a substantially stationary macro transfer head 132. As such, the alignment may be implemented by moving the table 126 on which the host substrate 120 is supported in the X direction, as indicated by the arrow, and/or in the Y direction (i.e., into or out of the plane of FIG. 3D).

After operation 484, embodiments may proceed to operation 485 that includes moving the host substrate 120 into contact with the macro transfer head 132, as shown in FIG. 3E. According to an embodiment, the host substrate 120 may be moved in the Z-direction towards the macro transfer head 132 so that the micro LEDs 360 contact the host substrate 120. In an embodiment, the macro transfer head 132 may also implement a bonding process when the micro LEDs 360 contact the host substrate 120. For example, the bonding process may be a TCB process. In such an embodiment, the micro transfer heads 238 may be heated in order to transfer thermal energy to the micro LEDs 360 to reflow a solder like material (not shown) on the host substrate 120 or on the micro LEDs 360 in order to secure the micro LEDs 360 to the host substrate 120.

After operation 485, embodiments may proceed to operation 486 that includes releasing the micro LEDs 360 from the micro transfer heads 238, as shown in FIG. 3F. In an embodiment, the micro LEDs 360 are released from the micro transfer heads 238 by switching off the force used to secure the micro LEDs 360. Additionally, the host substrate 120 may be moved away from the macro transfer head 112, as indicated by the arrow.

In an embodiment, the processing operations 481-486 may be repeated any number of times to transfer micro LEDs 360 from a donor substrate 112 to a host substrate 120. In an embodiment, the donor substrate 112 may be one donor substrate 112 of a plurality of donor substrates 112 in a donor substrate bank 110, and the macro transfer head 132 may be one macro transfer head 132 in an array of transfer heads 130. In such an embodiment, each transfer process (e.g., operations 481-486) may result in the transfer of millions of micro LEDs 360 from a plurality of donor substrates 112 to a plurality of segments 122 of the host substrate 120.

Embodiments of the invention may further improve the throughput by utilizing a bank of donor substrates that includes donor substrates for each of the three colors needed for a pixel. Such an embodiment is illustrated in FIG. 5.

Figure 5:
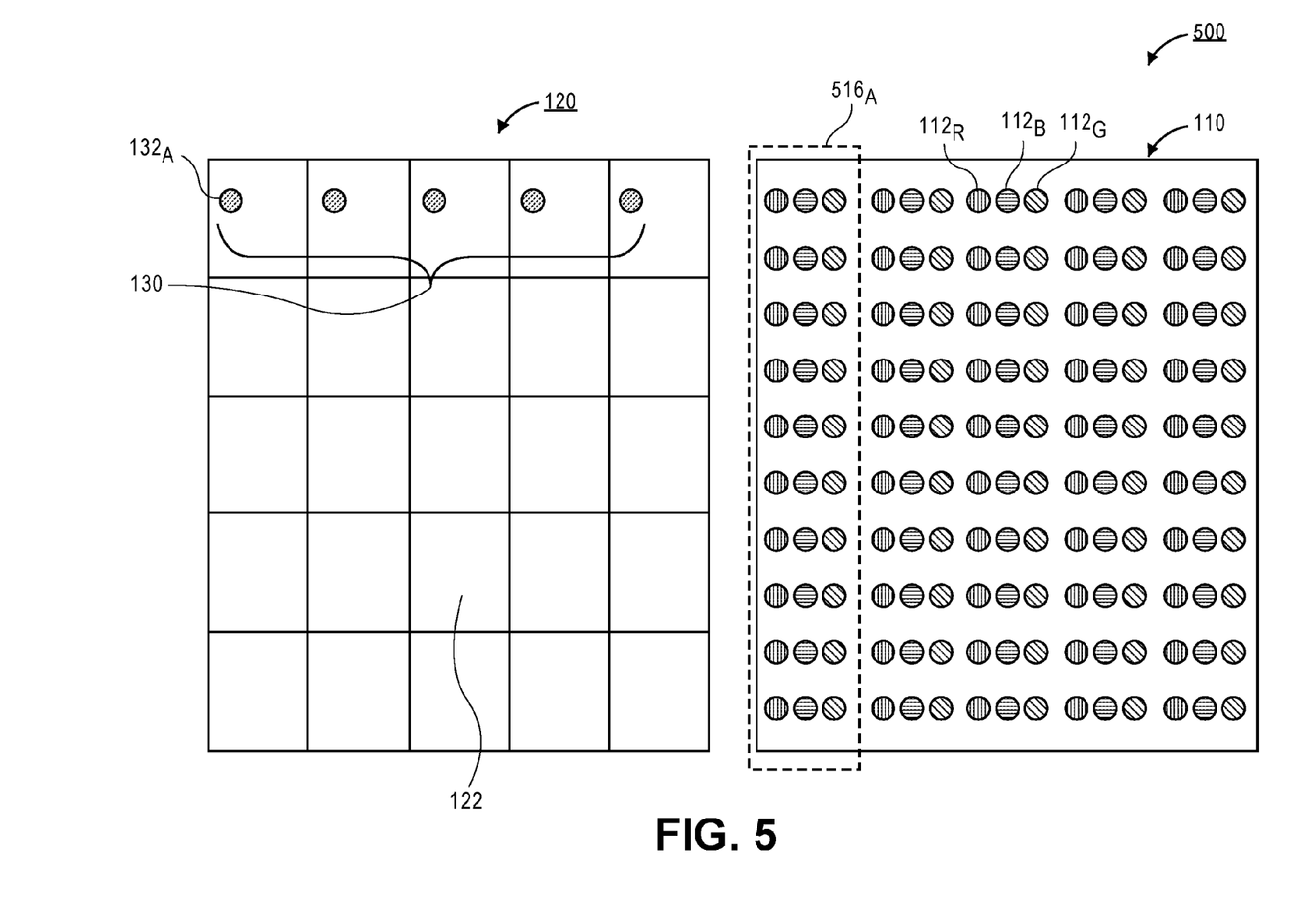
FIG. 5 is a plan view illustration of a system for transferring micro LEDs, according to an additional embodiment of the invention.

Referring now to FIG. 5, a plan view illustration of a micro LED transfer system is 500 is shown, according to an embodiment of the invention. The micro LED transfer system 500 is substantially similar to the systems described above, with the exception that the bank of donor substrates 510 includes red donor substrates $112_R$, green donor substrates $112_G$, and blue donor substrates $112_B$.

In an embodiment, each of the macro transfer heads 132 in the array of transfer heads 130 is responsible for transferring micro LEDs from a column 515 of donor substrates in the bank of donor substrates 110. For example, the leftmost macro transfer head $132_A$ may be used to transfer micro LEDs from the red, green, and blue donor substrates 112 in a first column $515_A$ of the bank of donor substrates 110. Accordingly, each macro transfer head 132 may be used to transfer red, green, and blue micro LEDs from donor substrates 112 in column $516_A$ of the donor substrate bank 110 to the leftmost column of segments 122 on the host substrate 120. For example, a first micro LED transfer process may be used to transfer red micro LEDs, a second micro LED transfer process may be used to transfer green micro LEDs, and a third micro LED process may be used to transfer blue micro LEDs.

Figure 6:
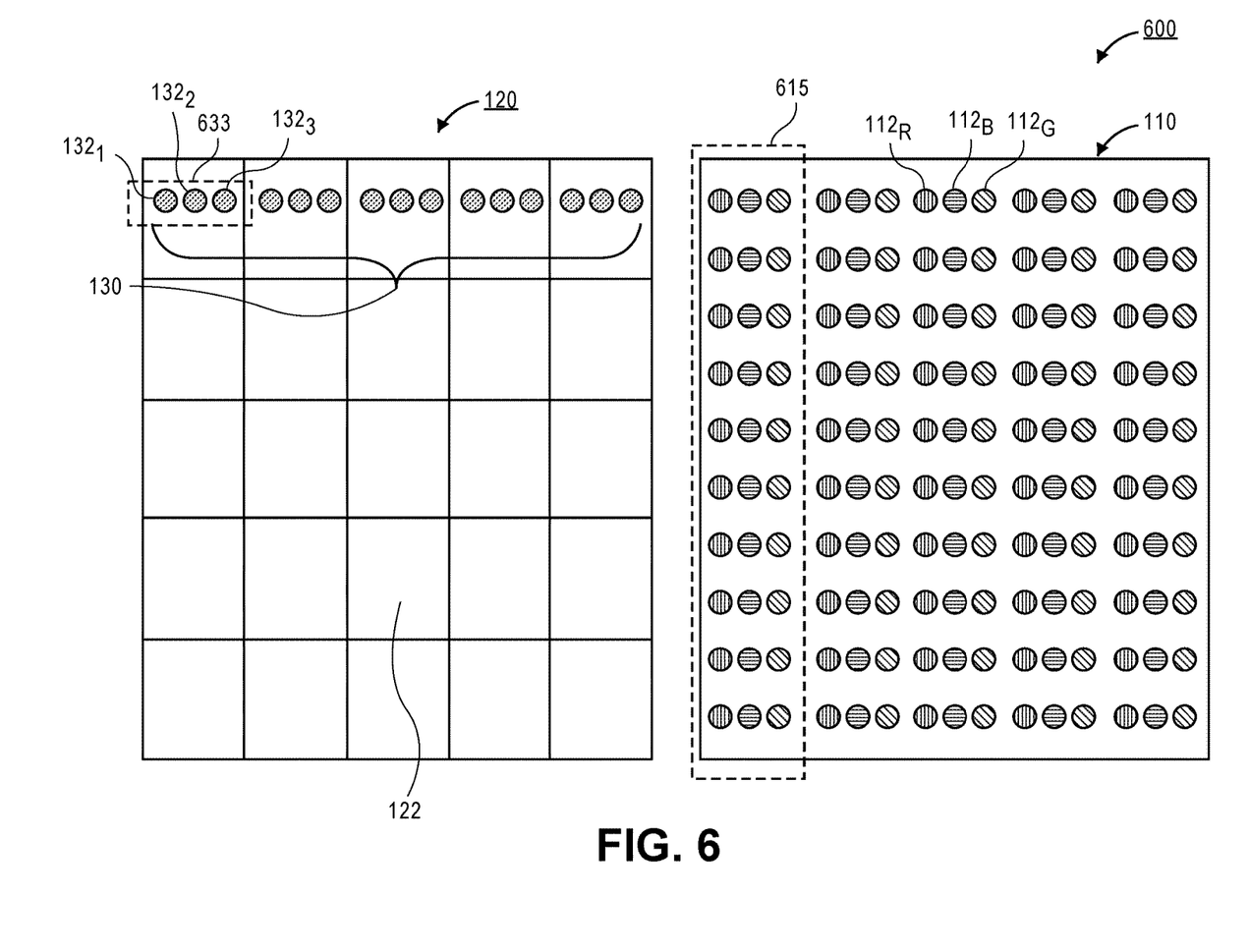
FIG. 6 is a plan view illustration of a system for transferring micro LEDs, according to an additional embodiment of the invention.

Referring now to FIG. 6 a plan view illustration of a micro LED transfer system is 600 is shown, according to an additional embodiment of the invention. The micro LED transfer system 600 is substantially similar to the system 500 described above, with the exception that the array of macro transfer heads 130 may include a plurality of macro transfer heads 132 assigned to each column of segments 122 of the host substrate 120. For example, a group 633 of three macro transfer heads $132_1$-$132_3$ may be used to transfer red, green, and blue micro LEDs to each segment 122 in the leftmost column of segments 122 of the host substrate 120. In such an embodiment, the group 633 of macro transfer heads 132 may each be responsible for transferring different colors of micro LEDs. For example, a first macro transfer head $132_1$ may be responsible for transferring red micro LEDs from red donor substrates $112_R$ in the first column 615, a second macro transfer head $132_2$ may be responsible for transferring blue micro LEDs from blue donor substrates $112_B$ in the first column 615, and a third macro transfer head $132_3$ may be responsible for transferring green micro LEDs from green donor substrates $112_G$ in the first column 615. Accordingly, the throughput may be increased since each transfer process may be used to transfer all three colors of micro LEDs simultaneously.

Figure 7:
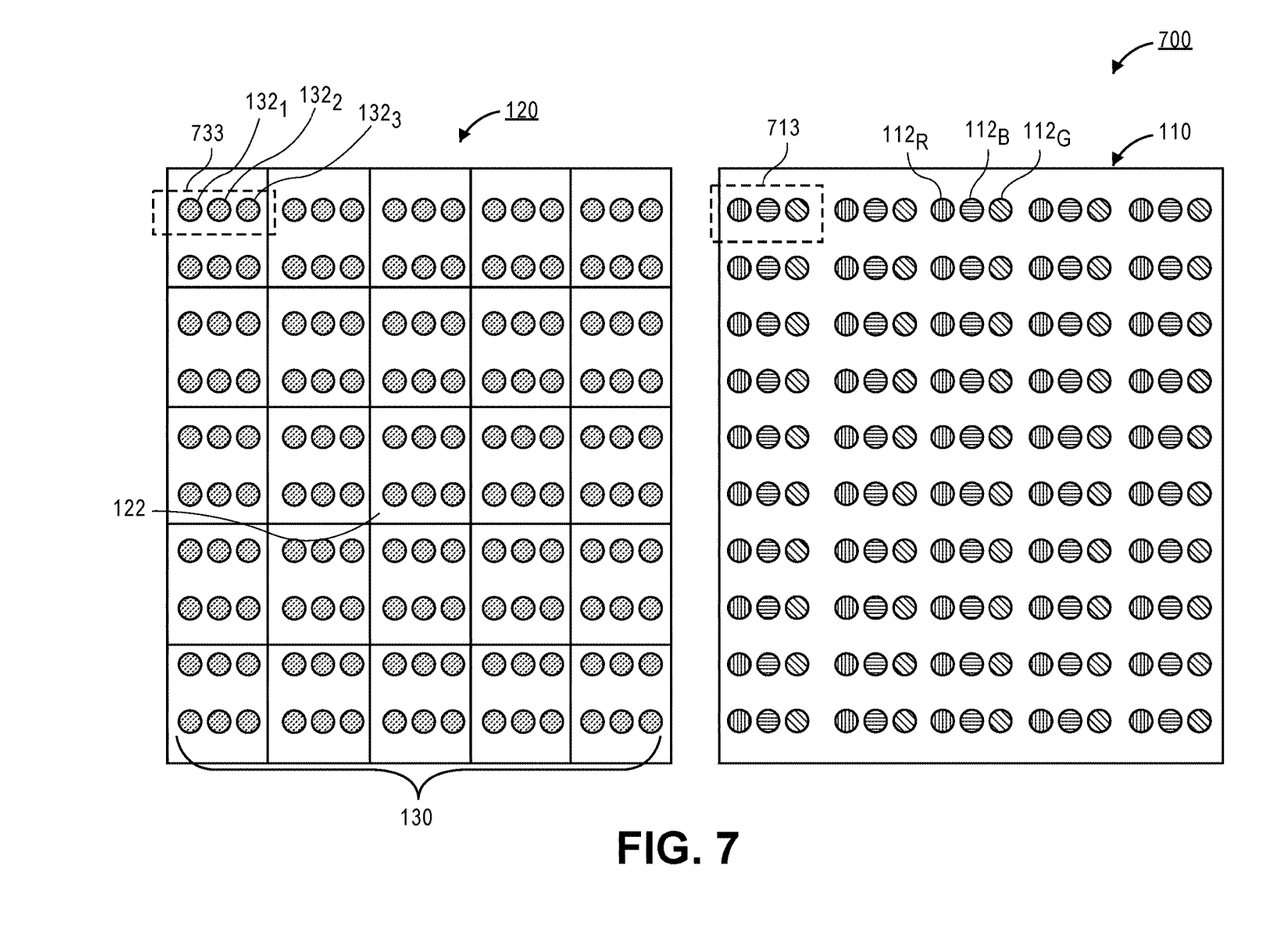
FIG. 7 is a plan view illustration of a system for transferring micro LEDs, according to an additional embodiment of the invention.

Referring now to FIG. 7 a plan view illustration of a micro LED transfer system 700 is shown, according to an additional embodiment of the invention. The micro LED transfer system 700 is substantially similar to the system 600 described above, with the exception that the array of macro transfer heads 130 may include a plurality of rows of macro transfer heads 132 that allow for transfer of micro LEDs more than one row of segments 122 in a single transfer process. In an embodiment, each segment 122 of the host substrate 120 may receive micro LEDs from more than one group 733 of macro transfer heads $132_1$-$132_3$ during each transfer process. In the illustrated embodiment, two groups 733 of macro transfer heads $132_1$-$132_3$ may be assigned to each segment 122. Furthermore, embodiments may include the same number of macro transfer heads 132 as there are donor substrates 112 in the bank of donor substrates 110. Accordingly, during a single transfer process, each segment 122 of the host substrate 120 may receive micro LEDs from two red donor substrates $112_R$, two green donor substrates $112_G$, and two blue donor substrates $112_B$. Therefore, the throughput of the micro LED transfer process may be significantly increased since each transfer process may result in red, green, and blue micro LEDs being mounted to each segment 122 of the host substrate 120 with every transfer operation.

Figure 8:
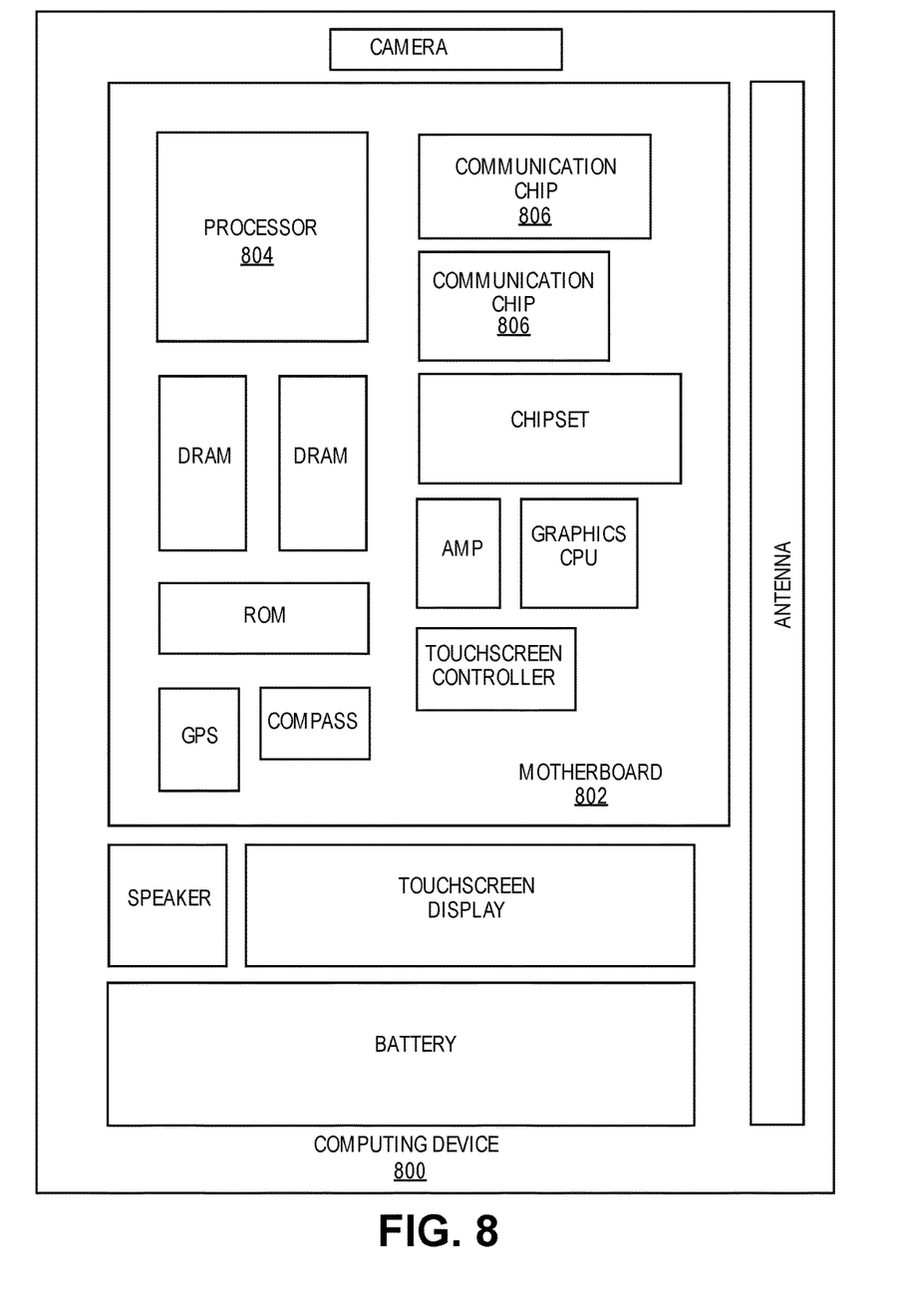
FIG. 8 is a schematic of a computing device built in accordance with an embodiment of the invention.

FIG. 8 illustrates a computing device 800 that may be used to implement micro LED transfer processes with micro LED transfer systems in accordance with embodiments of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may execute instructions that result in the implementation of a process for transferring micro LEDs, in accordance with implementations of the invention. The term "processor" may refer to any device or portion of a device that processes electronic data from registers and/or memory to transform that electronic data into other electronic data that may be stored in registers and/or memory.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1

A method of transferring micro light emitting diodes (LEDs), comprising: aligning a donor substrate with a macro transfer head, wherein the donor substrate includes a plurality of micro LEDs, and wherein the macro transfer head includes a plurality of micro transfer heads; moving the donor substrate towards the macro transfer head so that the plurality of micro LEDs each contact one of the micro transfer heads, wherein the micro transfer heads each secure one of the micro LEDs; removing the micro LEDs from the donor substrate by moving the donor substrate away from the macro transfer head; aligning a host substrate with the macro transfer head; moving the host substrate towards the macro transfer head so that the plurality of micro LEDs contact the host substrate; and bonding the micro LEDs to the host substrate.

Example 2

The method of Example 1, wherein the macro transfer head is substantially stationary during the transfer process.

Example 3

The method of Example 1 or Example 2, wherein the micro LEDs are bonded to the host substrate with a thermocompression bonding process.

Example 4

The method of Example 1, Example 2, or Example 3, wherein the micro LEDs are secured to the micro transfer heads with electrostatic force, vacuum force, Van Der Walls forces, or magnetic forces.

Example 5

The method of Example 1, Example 2, Example 3, Example 4, or Example 5, wherein the donor substrate is one of a plurality of donor substrates in a bank of donor substrates, and wherein the macro transfer head is one of a plurality of macro transfer heads in an array of macro transfer heads.

Example 6

The method of Example 5, wherein the plurality of macro transfer heads each transfer micro LEDs from different donor substrates with each transfer operation.

Example 7

The method of Example 5 or Example 6, wherein each donor substrate in the bank of donor substrates includes red, green, or blue micro LEDs.

Example 8

The method of Example 5, Example 6, or Example 7, wherein the host substrate includes a plurality of segments, wherein each segment is used to form a micro LED display.

Example 9

The method of Example 5, Example 6, Example 7, or Example 8, wherein micro LEDs are mounted on every segment of the host substrate with each transfer process.

Example 10

The method of Example 1, Example 2, Example 3, Example 4, Example 5, Example 6, Example 7, Example 8, or Example 9, wherein the macro transfer head is substantially the same size as the host substrate.

Example 11

The method of Example 1, Example 2, Example 3, Example 4, Example 5, Example 6, Example 7, Example 8, Example 9, or Example 10, wherein the number of micro transfer heads is equal to the number of micro LEDs formed on the donor substrate.

Example 12

A system for transferring micro light emitting diodes (LEDs), comprising: a donor substrate bank, wherein the donor substrate bank is capable of supporting a plurality of donor substrates on which a plurality of micro LEDs are formed, and wherein the donor substrate bank is moveable in the X, Y, and Z directions; a host substrate table, wherein the host substrate table is capable of supporting a host substrate that includes a plurality of segments, and wherein the host substrate table is moveable in the X, Y, and Z directions; and an array of macro transfer heads, wherein each macro transfer head includes a plurality of micro transfer heads.

Example 13

The system of Example 12, wherein the number of micro transfer heads on each macro transfer head is equal to the number of micro LEDs on each donor substrate.

Example 14

The system of Example 12 or Example 13, wherein the donor substrate bank can support donor substrates that include red LEDs, green LEDs, or blue LEDs.

Example 15

The system of Example 12, Example 13, or Example 14, wherein the number of macro transfer heads is equal to the number of donor substrates that the donor substrate bank can support.

Example 16

The system of Example 12, Example 13, Example 14, or Example 15, wherein the array of macro transfer heads does not move.

Example 17

The system of Example 12, Example 13, Example 14, Example 15, or Example 16, wherein each segment of the host substrate receives micro LEDs from a single macro transfer head.

Example 18

The system of Example 12, Example 13, Example 14, Example 15, Example 16, or Example 17, wherein each segment of the host substrate receives micro LEDs from a plurality of macro transfer heads.

Example 19

The system of Example 12, Example 13, Example 14, Example 15, Example 15, Example 16, Example 17, or Example 18, wherein the micro transfer heads secure micro LEDs with electrostatic force, magnetic force, Van Der Waals forces, or vacuum forces.

Example 20

The system of Example 12, Example 13, Example 14, Example 15, Example 15, Example 16, Example 17, Example 18, or Example 19, wherein the micro transfer heads mount micro LEDs to the host substrate with a thermocompression bonding process.

Example 21

The system of Example 12, Example 13, Example 14, Example 15, Example 15, Example 16, Example 17, Example 18, Example 19, or Example 20 wherein the micro transfer heads of each macro transfer head are individually addressable.

Example 22

The system of Example 12, Example 13, Example 14, Example 15, Example 15, Example 16, Example 17, Example 18, Example 19, Example 20, or Example 21, wherein the macro transfer heads include a metallic material or silicon.

Example 23

A macro transfer head for transferring micro LEDs, comprising: a transfer head body; and a plurality of micro transfer heads for securing micro LEDs, wherein the micro transfer heads secure micro LEDs with electrostatic forces, magnetic forces, Van Der Waals forces, or vacuum forces, and wherein the micro transfer heads mount the micro LEDs to a host substrate with thermocompression bonding.

Example 24

The macro transfer head of Example 23, wherein the number of micro transfer heads is equal to the number of micro LEDs formed on a donor substrate.

Example 25

The macro transfer head of Example 23 or Example 24, wherein the macro transfer head is one macro transfer head in an array of macro transfer heads.

What is claimed is:
1. A method of transferring micro light emitting diodes (LEDs), comprising:
aligning a donor substrate with a macro transfer head, wherein the donor substrate includes a plurality of micro LEDs, and wherein the macro transfer head includes a plurality of micro transfer heads;
moving the donor substrate towards the macro transfer head so that the plurality of micro LEDs each contact one of the micro transfer heads, wherein the micro transfer heads each secure one of the micro LEDs;
removing the micro LEDs from the donor substrate by moving the donor substrate away from the macro transfer head;
aligning a host substrate with the macro transfer head;
moving the host substrate towards the macro transfer head so that the plurality of micro LEDs contact the host substrate; and bonding the micro LEDs to the host substrate; wherein the macro transfer head is substantially stationary during the transfer process.

2. The method of claim 1, wherein the micro LEDs are bonded to the host substrate with a thermocompression bonding process.

3. The method of claim 1, wherein the micro LEDs are secured to the micro transfer heads with electrostatic force, vacuum force, Van Der Walls forces, or magnetic forces.

4. The method of claim 1, wherein the donor substrate is one of a plurality of donor substrates in a bank of donor substrates, and wherein the macro transfer head is one of a plurality of macro transfer heads in an array of macro transfer heads.

5. The method of claim 4, wherein the plurality of macro transfer heads each transfer micro LEDs from different donor substrates with each transfer operation.

6. The method of claim 5, wherein each donor substrate in the bank of donor substrates includes red, green, or blue micro LEDs.

7. The method of claim 5, wherein the host substrate includes a plurality of segments, wherein each segment is used to form a micro LED display.

8. The method of claim 7, wherein micro LEDs are mounted on every segment of the host substrate with each transfer process.

9. The method of claim 1, wherein the macro transfer head is substantially the same size as the host substrate.

10. The method of claim 9, wherein the number of micro transfer heads is equal to the number of micro LEDs formed on the donor substrate.

11. A system for transferring micro light emitting diodes (LEDs), comprising:
a donor substrate bank, wherein the donor substrate bank is capable of supporting a plurality of donor substrates on which a plurality of micro LEDs are formed, and wherein the donor substrate bank is moveable in the X, Y, and Z directions;
a host substrate table, wherein the host substrate table is capable of supporting a host substrate that includes a plurality of segments, and wherein the host substrate table is moveable in the X, Y, and Z directions; and
an array of macro transfer heads, wherein each macro transfer head includes a plurality of micro transfer heads.

12. The system of claim 11, wherein the number of micro transfer heads on each macro transfer head is equal to the number of micro LEDs on each donor substrate.

13. The system of claim 11, wherein the donor substrate bank can support donor substrates that include red LEDs, green LEDs, or blue LEDs.

14. The system of claim 13, wherein the number of macro transfer heads is equal to the number of donor substrates that the donor substrate bank can support.

15. The system of claim 11, wherein the array of macro transfer heads does not move.

16. The system of claim 11, wherein each segment of the host substrate receives micro LEDs from a single macro transfer head.

17. The system of claim 11, wherein each segment of the host substrate receives micro LEDs from a plurality of macro transfer heads.

18. The system of claim 11, wherein the micro transfer heads secure micro LEDs with electrostatic force, magnetic force, Van Der Waals forces, or vacuum forces.

19. The system of claim 18, wherein the micro transfer heads mount micro LEDs to the host substrate with a thermocompression bonding process.

20. The system of claim 11, wherein the micro transfer heads of each macro transfer head are individually addressable.

21. The system of claim 20, wherein the macro transfer heads include a metallic material or silicon.

22. An array of macro transfer heads for transferring micro LEDs, wherein each macro transfer head in the array of macro transfer heads comprises:
a transfer head body; and
a plurality of micro transfer heads for securing micro LEDs, wherein the micro transfer heads secure micro LEDs with electrostatic forces, magnetic forces, Van Der Waals forces, or vacuum forces, and wherein the micro transfer heads mount the micro LEDs to a host substrate with thermocompression bonding.

23. The array of macro transfer heads of claim 22, wherein the number of micro transfer heads on each macro transfer head is equal to the number of micro LEDs formed on a donor substrate.

* * * * *